(12) United States Patent
Besser et al.

(10) Patent No.: US 6,642,590 B1
(45) Date of Patent: *Nov. 4, 2003

(54) METAL GATE WITH PVD AMORPHOUS SILICON LAYER AND BARRIER LAYER FOR CMOS DEVICES AND METHOD OF MAKING WITH A REPLACEMENT GATE PROCESS

(75) Inventors: Paul R. Besser, Austin, TX (US); Qi Xiang, San Jose, CA (US); Matthew S. Buynoski, Palo Alto, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 44 days.

This patent is subject to a terminal disclaimer.

(21) Appl. No.: 09/691,227

(22) Filed: Oct. 19, 2000

(51) Int. Cl.$^7$ .................................................. H01L 29/76
(52) U.S. Cl. ........................................ 257/410; 257/412
(58) Field of Search .............................. 257/413, 915, 257/410, 412, 401

(56) References Cited

U.S. PATENT DOCUMENTS

| | | | | |
|---|---|---|---|---|
| 5,710,454 A | * | 1/1998 | Wu ............................ | 257/413 |
| 5,960,270 A | | 9/1999 | Misra et al. ................. | 438/197 |
| 6,107,667 A | * | 8/2000 | An et al. ..................... | 257/408 |
| 6,159,782 A | * | 12/2000 | Xiang et al. ................ | 438/197 |
| 6,291,868 B1 | * | 9/2001 | Weimer et al. .............. | 257/413 |
| 6,335,254 B1 | * | 1/2002 | Trivedi ........................ | 257/413 |
| 6,392,280 B1 | * | 5/2002 | Besser et al. ................ | 257/410 |
| 6,436,840 B1 | * | 8/2002 | Besser et al. ................ | 438/721 |

* cited by examiner

Primary Examiner—Mark V. Prenty

(57) ABSTRACT

A semiconductor structure and method for making the same provides a metal gate on a silicon substrate. The gate includes a high dielectric constant on the substrate, and a physical vapor deposited (PVD) layer of amorphous silicon on the high k gate dielectric. A barrier layer is deposited on the PVD amorphous silicon layer. The metal is then formed on the barrier layer. The work function of the metal gate is substantially the same as a polysilicon gate due to the presence of the PVD amorphous silicon layer. The barrier layer prevents interaction between the PVD amorphous silicon layer and the metal, thereby allowing higher temperature subsequent processing while preserving the work function of the gate.

8 Claims, 3 Drawing Sheets

METAL GATE WITH PVD AMORPHOUS SILICON LAYER AND BARRIER LAYER FOR CMOS DEVICES AND METHOD OF MAKING WITH A REPLACEMENT GATE PROCESS

RELATED APPLICATIONS

The present invention contains subject matter similar to that disclosed in U.S. patent application Ser. No. 09/691,188, filed on Oct. 19, 2000 and now U.S. Pat. No. 6,436,840; U.S. Pat. application Ser. No. 09/691,180, filed on Oct. 19, 2000 and now U.S. Pat. No. 6,440,867; U.S. patent application Ser. No. 09/691,226, filed on Oct. 19, 2000; and U.S. patent application Ser. No. 09/691,224, filed on Oct. 19, 2000 and now U.S. Pat. No. 6,392,280.

FIELD OF THE INVENTION

The present invention relates to the field of semiconductor processing, and more particularly, to the formation of metallic gate electrodes using the replacement gate process technique.

BACKGROUND OF THE INVENTION

In the integrated circuit (IC) industry, metal-oxide-semiconductor (MOS) transistors have typically been formed utilizing polysilicon gate electrodes. Polysilicon material has been preferred for use as an MOS gate electrode due to its thermal resistive properties (i.e., polysilicon can better withstand subsequent high temperature processing). Polysilicon's robustness during high temperature processing allows polysilicon to be annealed at high temperatures along with source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed.

However, polysilicon gate electrodes have certain disadvantages. For example, polysilicon gate electrodes are formed from semiconductor materials that suffer from higher resistivities than most metal materials. Therefore, polysilicon gate electrodes may operate at much slower speeds than gates made of metallic materials. To partially compensate for this higher resistance, polysilicon materials often require extensive and expensive silicide processing in order to increase their speed of operation to acceptable levels.

A need exists in the industry for a metal gate device which can replace a polysilicon gate device. However, metal gates can not withstand the higher temperatures and oxidation ambients which can be withstood by conventional polysilicon gate electrodes. In efforts to avoid some of the concerns with polysilicon gate electrodes, a replacement damascene metal gate process has been created. A damascene gate process uses a disposable gate, which is formed with a source, drain, spacer, etch stops and anti-reflective coatings as in conventional processing. However, the disposable gate and dielectrics are etched away, exposing an original gate oxide. The disposable polysilicon gate is then replaced by a metal gate to achieve the lower resistivity provided by the metal material.

A design consideration in semiconductor technology is that of the work function, which is the amount of energy required to excite electrons across a threshold. Polysilicon gates on silicon substrates provide a work function that allows the gates to be adequately controlled. The use of metal, however, as the gate material on a silicon substrate undesirably changes the work function in comparison to polysilicon gates. This reduces the controllability of the gate.

SUMMARY OF THE INVENTION

There is a need for a semiconductor structure and arrangement for making the same in which the gate is made of a metal, but the work function is substantially the same as a semiconductor structure which contains a polysilicon gate.

This and other needs are met by the embodiments of the present invention which provide a semiconductor structure comprising a substrate, active regions in the substrate, and a gate structure on the substrate. This gate structure includes a high dielectric constant (high k) gate dielectric on the substrate, a physical vapor deposited (PVD) layer of amorphous silicon on the high k gate dielectric, a barrier on the PVD amorphous silicon layer, and a metal on the barrier. The barrier comprises a material that prevents interaction between the metal and the PVD amorphous silicon layer.

By providing a semiconductor structure having a gate structure with a PVD layer of amorphous silicon and a metal on the PVD amorphous silicon layer, the advantages of a metal gate, including that of lower resistivity, is achieved without compromising the work function of the gate structure. Hence, the PVD amorphous silicon layer causes the work function of the metal gate to appear like a standard gate. Also, a PVD amorphous silicon layer is less resistive than conventionally formed CVD amorphous silicon, which makes the gate structure as a whole less resistive. The barrier provided between the PVD amorphous silicon layer and the metal prevents interaction, such as silicidation, from occurring during further processing. Since the PVD amorphous silicon layer is not undesirably silicidized, the work function of the gate electrode is preserved. Hence, the barrier allows higher temperatures to be employed in continued processing of the device, without concern that the work function will be compromised by unintentional formation of silicide within the gate electrode.

The earlier stated needs are also met by embodiments of the present invention that provide a method of forming a semiconductor structure, comprising the steps of forming a precursor having a substrate with active regions separated by a channel, and a temporary gate over the channel and between dielectric structures. The temporary gate is removed to form a recess with a bottom and sidewalls between the dielectric structures. Amorphous silicon is deposited in the recess by physical vapor deposition. A barrier layer is deposited over the amorphous silicon. A metal is then deposited in the recess on the barrier layer. The barrier layer prevents interaction of the metal with the amorphous silicon.

The formation of a semiconductor structure in accordance with the present invention is advantageous in that high-temperature processes may be performed both prior to and after the deposition of the metal gate. Also, the formation of source and drain electrodes self-aligned to the subsequently formed metal gate is possible. The formation of the metal gate in this replacement gate process, however, allows the metal gate to be formed after the implantation of the dopant atoms. By depositing amorphous silicon in the recess by physical vapor deposition prior to the depositing of the metal in the recess on the amorphous silicon, the work function will be same as if the gate were made of polysilicon instead of metal. This provides increased control of the gate and avoids leakage. The work function is preserved by the use of a barrier layer that prevents interaction between the PVD amorphous silicon layer and the metal layer, even at higher temperatures during further processing.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the use of metal gates in semiconductor structures. In conventional semiconductor structures using replacement metal gates, the work function has changed due to the use of metal on a silicon substrate. The present invention provides a work function that is at least substantially the same as the work function of a polysilicon gate on a silicon substrate, and preserves this work function during higher temperature processing of the semiconductor structure after the gate electrode is formed. This is achieved by providing a physical vapor deposited amorphous silicon layer over the silicon substrate. The metal of the gate structure is deposited on the amorphous silicon. The presence of the amorphous silicon between the metal gate and the silicon substrate causes the work function to be substantially the same as the work function of a polysilicon gate on a silicon substrate. At the same time, however, the resistance of the gate is reduced due to the replacement of the polysilicon gate with the metal gate structure. The use of a barrier layer between the PVD amorphous silicon and the metal prevents interaction, such as silicidation, from occurring in subsequent processing of the semiconductor structure. This allows more freedom for the process engineer in designing the processing subsequent to formation of the gate electrode.

Figure 1:
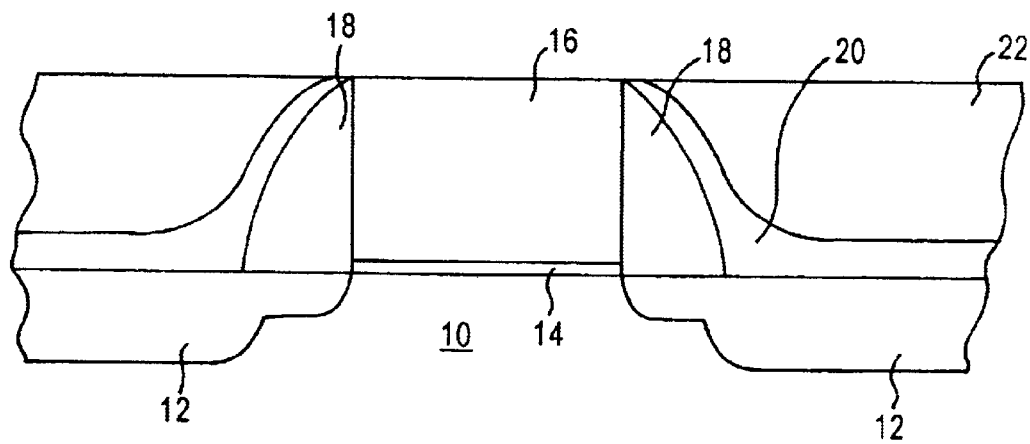
FIG. 1 is a schematic depiction of a cross-section of a semiconductor structure precursor in accordance with embodiments of the present invention.

FIG. 1 is a cross-section of a precursor for the semiconductor structure constructed in accordance with embodiments of the present invention. In the following description, the features in the drawings are not necessarily represented accurately in terms of relative sizes or shapes, but have been rendered for illustrative purposes.

In FIG. 1, the silicon substrate 10 has active regions 12 formed therein by conventional doping techniques. A gate oxide 14 has been provided on the surface of the substrate 10. A polysilicon gate 16, which serves as a temporary (or "dummy") gate is provided on top of the gate oxide 14.

Spacers 18 are provided on the sidewalls of the gate 16. The sidewalls 18 may be made of material, such as silicon nitride, silicon oxide, silicon oxynitride, or different layers thereof. Layer 20 is an etch stop layer and/or a bottom anti-reflective coating (BARC) layer. A dielectric layer 22 is provided on top of the BARC layer 20. The semiconductor structure of FIG. 1 has been planarized, by chemical mechanical planarization (CMP), for example, to provide a planarized upper surface.

The structure of FIG. 1 is a conventional semiconductor structure with active regions and a polysilicon gate. In order to provide a gate with reduced resistivity, however, the polysilicon gate 16 may be removed and replaced by a metal gate, as provided for in the present invention. As noted earlier, however, the use of a metal gate structure undesirably changes the work function of the gate. This is avoided in the present invention by the use of a physical vapor deposited amorphous silicon layer, and preserved by the use of a barrier layer.

Figure 2:
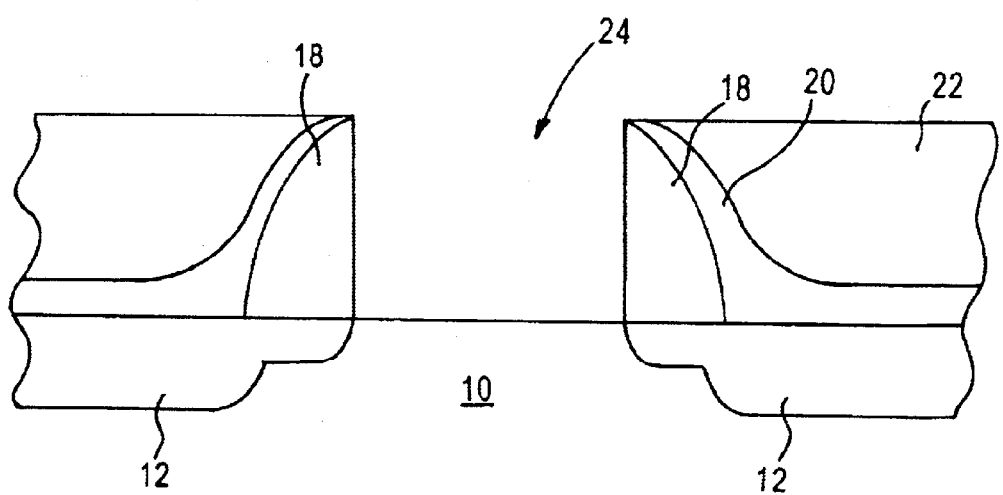
FIG. 2 depicts the structure of FIG. 1 after the dummy gate and the gate dielectric have been removed.

In FIG. 2, the polysilicon gate 16 and gate oxide 14 have been removed from the region between spacers 18. This leaves a recess 24 bounded by the top of the substrate 10 and the sidewalls formed by the spacers 18. A plasma reactive ion etch (RIE) using chlorine or a wet polysilicon etch using conventional etch chemistry may be utilized to remove the polysilicon layer to form the opening (i.e. recess) 24.

Figure 3:
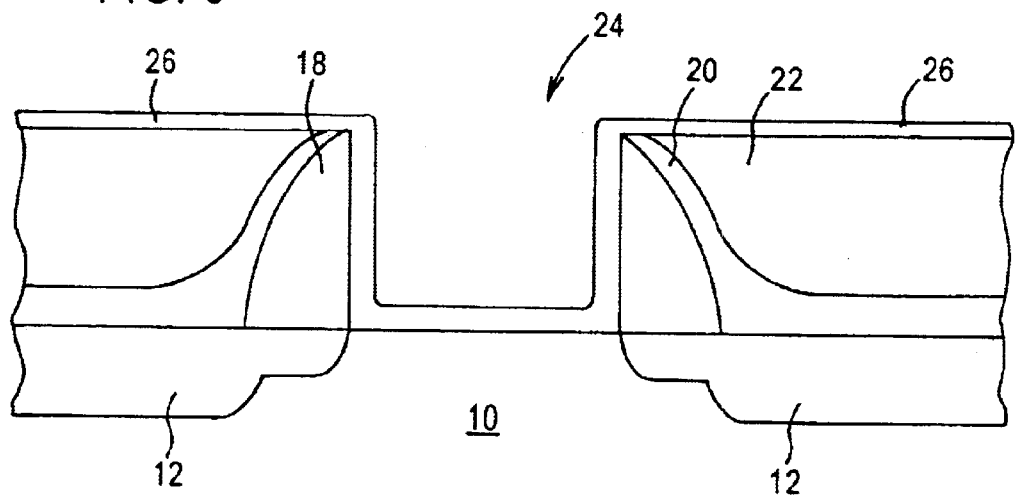
FIG. 3 shows the semiconductor structure of FIG. 2 after a high k dielectric has been deposited.

In FIG. 3, a high k dielectric is provided as layer 26 within the recess 24. The high k gate dielectric 26 can provided in a layer having a thickness between about 15 and about 200 Angstroms thick, for example. Conventional methods of deposition, such as physical vapor deposition, may be used to deposit the high k gate dielectric layer 26. Typical materials that may be used in the high k gate dielectric layer 26 include $ZrO_2$, $HfO_2$, $InO_2$, $LaO_2$, $TaO_2$, for example. Other multiple metal oxides may be used or perovskites may be employed as the high k gate dielectric material in layer 26.

A reason for using high k material as a gate dielectric is that it provides better electrical coupling with the gate and the channel. Furthermore, silicon dioxide is no longer extendible. Tunneling leakage is an important consideration. With high k material, a thicker film can be used while still obtaining the same electric field. One of the concerns with high k material, however, is its low temperature stability. In other words, at high temperatures, high k materials react with the silicon substrate. Processing at lower temperatures, such as with nickel silicide, mitigate this concern.

Figure 4:
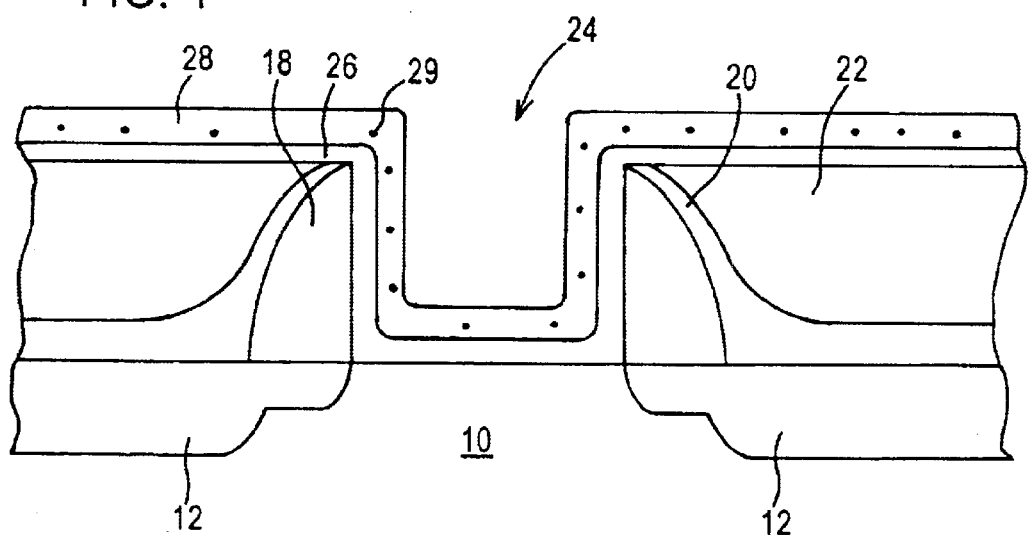
FIG. 4 depicts the semiconductor structure of FIG. 3 following the physical vapor deposition of amorphous silicon over the high k gate dielectric.
Figure 5:
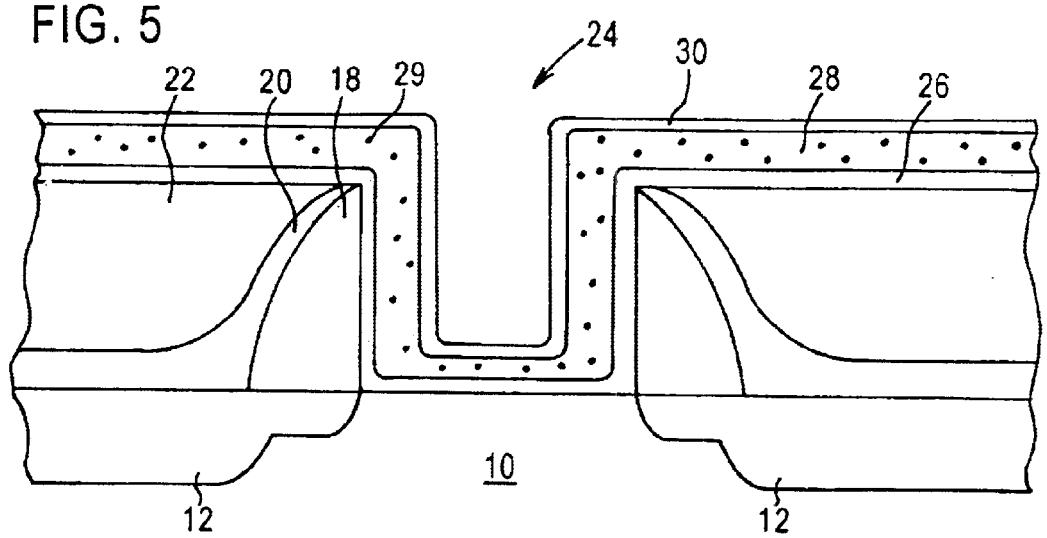
FIG. 5 depicts the semiconductor structure of FIG. 4 after a barrier layer has been deposited over the PVD amorphous silicon layer, in accordance with embodiments of the present invention.

FIG. 4 depicts the semiconductor structure of FIG. 3 after the deposition of an amorphous silicon layer 28. The amorphous silicon layer 28 is provided within the recess 24 on top of the high k gate dielectric layer 26. In the present invention, the amorphous silicon layer 28 is deposited by physical vapor deposition. Hence, the layer 28 is a PVD amorphous silicon layer.

For example, the PVD can take place at a temperature between approximately room temperature and approximately 300° C. Power can be controlled between about 300–2000 W. Pressure nay be maintained between 1 to about 10 millitorr. A silicon target is provided in the PVD chamber. The silicon target has some doping (B or P) so that the PVD silicon layer 28 is conductive. The doping is relatively light, so that the resistivity is greater than 2000 ohms/$cm^2$. Argon gas is used in the sputtering process.

A thickness of the PVD amorphous silicon layer 28 is between approximately 50 and approximately 500 Angstroms in certain preferred embodiments, and between approximately 50 and approximately 200 Angstroms in especially preferred embodiments. Such thicknesses are typically used when the final gate structure is between approximately 1000 and approximately 2000 Angstroms high. Compared to a CVD amorphous silicon layer, a PVD amorphous silicon layer exhibits less uniformity of thickness since it does not have as good a step coverage. Hence, the thickness on the bottom will normally be slightly greater than the thickness on the sidewalls.

Following the deposition of the PVD amorphous silicon layer 28, a barrier layer 30 is deposited over the PVD amorphous silicon layer 28. The barrier layer 30, in certain embodiments of the invention, may comprise TiN, or $WN_x$, or TiW, for example. The material used in the barrier layer 30 should be sufficient to prevent interaction between the PVD amorphous silicon layer 28 and a metal layer that will be subsequently deposited. This allows higher temperature processing to be employed without concern that all of the silicon in the gate will be converted into suicide and thereby change the work function.

Figure 6:
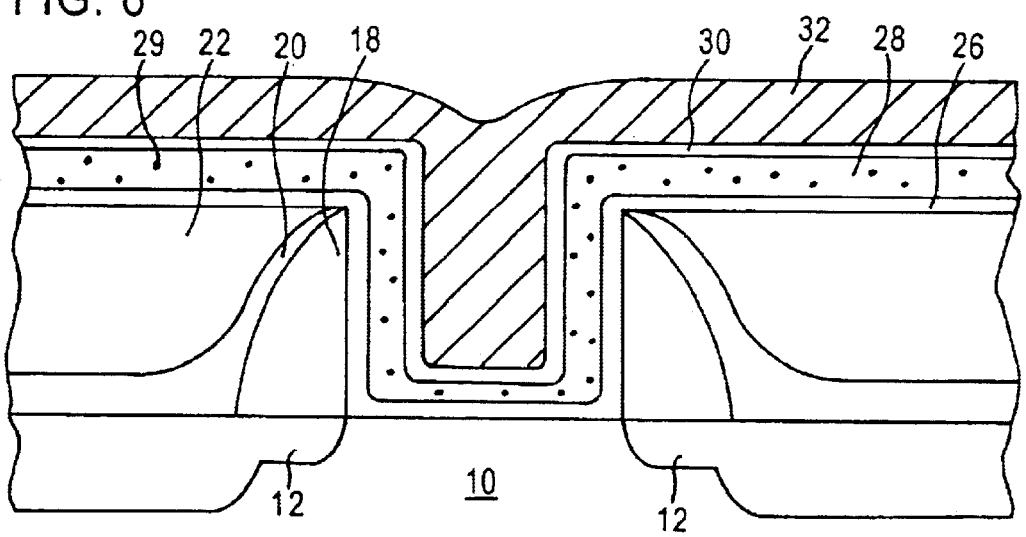
FIG. 6 illustrates the semiconductor structure of FIG. 5 after a metal has been deposited within the recess in accordance with the embodiments of the present invention.

FIG. 6 depicts the semiconductor structure after a metal layer 32 is deposited over the amorphous silicon layer 28. The deposition may take place by chemical vapor deposition, for example. The metal that is deposited in metal layer 32 may be any number of different types of metals, such as tungsten, titanium, molybdenum, nickel, etc. The CVD deposition of the metal layer 32 is achieved by conventional deposition techniques.

Figure 7:
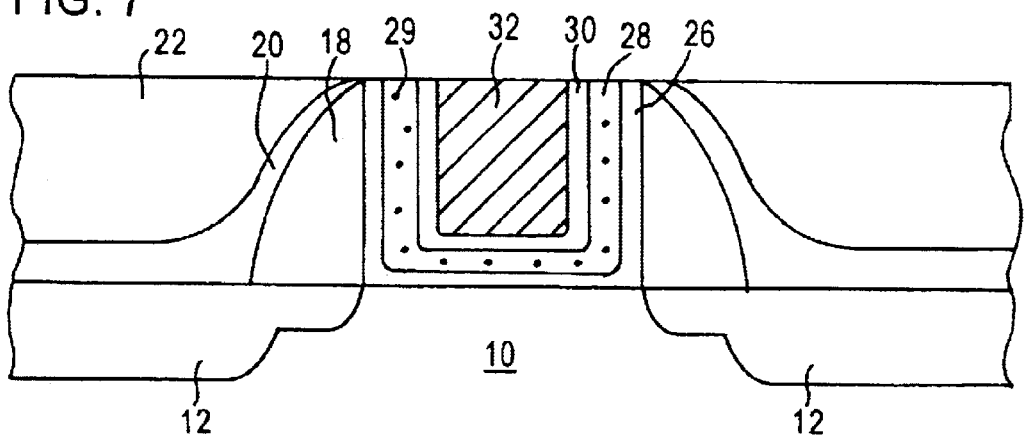
FIG. 7 is a cross-section of the semiconductor structure of FIG. 6 after a planarizing procedure has been performed.

In FIG. 7, the semiconductor structure of FIG. 6 has been planarized, by physical mechanical planarization, for example. This presents a smooth, top surface suitable for further processing. The semiconductor structure now has a complete replacement gate electrode comprising the high k gate dielectric 26, the PVD amorphous silicon 28, the barrier layer 30, and the metal 32.

The gate structure depicted in FIG. 7 exhibits the lower resistivity provided by a metal gate, but does not have a changed work function in comparison to a polysilicon gate due to the presence of the PVD amorphous silicon layer 28. By providing the PVD amorphous silicon layer within the gate structure, between the metal and silicone substrate, the gate structure appears electrically like a polysilicon gate. Control of the gate is therefore improved over conventional metal gates. The barrier layer between the PVD amorphous silicon layer and the metal layer allows the gate electrode to be subjected to higher temperature processing without compromising the work function.

Although the present invention has been described and illustrated in detail, it is to be clearly understood that the same is by way of illustration and example only is not to be taken by way of limitation, scope of the present invention by limited only by the terms the appended claims.

What is claimed is:

1. A semiconductor structure comprising:
   a substrate;
   active regions in the substrate; and
   a gate structure on the substrate, wherein the gate structure includes:
   a high dielectric constant (high k) gate dielectric on the substrate,
   a physical vapor deposited (PVD) layer of amorphous silicon on the high k gate dielectric,
   a barrier on the PVD amorphous silicon layer,
   a metal on the barrier, wherein the barrier comprises a material that prevents interaction between the metal and the PVD amorphous silicon layer; and
   a dielectric layer formed on the substrate and having a recess with a bottom and sidewalls, wherein the gate structure is within the recess.

2. The semiconductor structure of claim 1, wherein the barrier material includes at least one of TiN, $WN_x$, and TiW.

3. The semiconductor structure of claim 2, wherein the metal includes at least one of W, Mo, Co, Ti, Ni and a metal silicide.

4. The semiconductor structure of claim 1, wherein the PVD amorphous silicon layer contains PVD deposited dopants.

5. The semiconductor structure of claim 4, wherein the dopants at least one of boron, arsenic, and phosphorous.

6. The semiconductor structure of claim 5, wherein the barrier is between approximately 50 to approximately 400 Angstroms thick.

7. The semiconductor structure of claim 1, wherein the barrier is between approximately 50 to approximately 400 Angstroms thick.

8. The semiconductor structure of claim 1, wherein the gate structure has a work function that is approximately the same as a work function of a polysilicon gate.

* * * * *